United States Patent
Dugger et al.

(10) Patent No.: US 8,071,164 B1
(45) Date of Patent: Dec. 6, 2011

(54) METHOD FOR LUBRICATING CONTACTING SURFACES

(75) Inventors: Michael T. Dugger, Tijeras, NM (US); James A. Ohlhausen, Albuquerque, NM (US); David B. Asay, Boalsburg, PA (US); Seong H. Kim, State College, PA (US)

(73) Assignee: Sandia Corporation, Albuquerque, NM (US)

( * ) Notice: Subject to any disclaimer, the term of this patent is extended or adjusted under 35 U.S.C. 154(b) by 791 days.

(21) Appl. No.: 12/116,243

(22) Filed: May 7, 2008

Related U.S. Application Data

(60) Provisional application No. 60/973,888, filed on Sep. 20, 2007.

(51) Int. Cl.
 *C23C 16/00* (2006.01)
(52) U.S. Cl. .................. 427/248.1; 427/255.23
(58) Field of Classification Search ............... 427/248.1, 427/255.23; 72/38, 41
 See application file for complete search history.

(56) References Cited

OTHER PUBLICATIONS

Strawhecker et al. Reduction of adhesion and friction of silicon oxide surface in the presence of n-propanol vapor in the gas phase, Tribological Letters, vol. 19 No. 1, May 2005, pp. 17-21.*
Asay, Dugger, Ohlhausen, and Kim, Macro- to Nanoscale Wear Prevention via MolecularAdsorption, Dept of Chemical Engineering , American Chemical Society, Published on Web., 2007.
Strawhecker, Asay, McKinney and Kim, Reduction of adhesion and friction of silicon oxide surface in the presence of n-propanol vapor in the gas phase, 2005 Springer Science+ Business Media, Inc., 2005.

* cited by examiner

*Primary Examiner* — Kelly M Gambetta
(74) *Attorney, Agent, or Firm* — Elmer A. Klavetter; Kevin W. Bieg

(57) ABSTRACT

A method is provided for tribological lubrication of sliding contact surfaces, where two surfaces are in contact and in motion relative to each other, operating in a vapor-phase environment containing at least one alcohol compound at a concentration sufficiently high to provide one monolayer of coverage on at least one of the surfaces, where the alcohol compound continuously reacts at the surface to provide lubrication.

5 Claims, 3 Drawing Sheets

METHOD FOR LUBRICATING CONTACTING SURFACES

RELATED APPLICATIONS

This application claims the benefit of U.S. Provisional Application No. 60/973,888, filed on Sep. 20, 2007.

This invention was made with Government support under Contract No. DE-AC04-94AL85000 awarded by the Department of Energy and Contract No. CMMI-0625493 awarded by the National Science Foundation. The Government has certain rights in the invention.

BACKGROUND OF THE INVENTION

The present invention relates generally to a method of lubricating contacting, sliding surfaces and, more particularly, to lubricating contacting and rubbing surfaces exemplified in microelectromechanical (MEMS) systems using a vapor-phase operating environment.

Commercially successful MEMS devices to date have either nonmoving parts or contacts whose lateral motion is very restricted. Many more exciting applications can be attained with MEMS devices consisting of moving, touching, and rubbing structures. These include gears and motors that can enable much more complicated mechanical functions at the micro- and nano-scale. However, the effects of adhesion, friction and wear of MEMS devices are challenging the development and commercialization of more sophisticated micromachines.

The tribological behavior of contacts in MEMS technologies differs from those in macroscopic engineering structures. At the macroscopic scale, millions of asperities give rise to the parametric relationships that we are familiar with, such as Amanton's law which depicts the friction coefficient to be independent of contact area and applied load. In MEMS, real mechanical contacts typically consist of a few nanometer-scale asperities that touch. At these small scales, Amonton's law breaks down and individual asperity contact behavior must be considered. Additionally, forces that are negligible at the macro-scale become significant at the microscopic length scale and smaller. These include electrostatic or van der Waals forces between contacting and non-contacting surfaces, and capillary forces due to liquid menisci. In the macroscopic scale, gravity dominates over adhesion. However, in the micro- and nano-scale, gravitational and inertial forces are negligible and adhesion becomes significant. It is important to point out that in some cases the magnitude of these forces is comparable to the actuation forces that can be provided with on-chip actuators.

Adhesion, friction and wear have been the greatest limitations to the development of MEMS devices that rely on contacting and rubbing surfaces. These tribological problems associated with micromachines cannot be solved by applying conventional lubricants utilized in the macro-scale, such as liquid lubricants. In micromachines, the viscosity of liquid lubricants causes severe power dissipation problems and causes devices to move slowly, negating one of the principal advantages of micromachines, i.e. low inertia that enables rapid mechanical switching.

Coupling agents having a functional end that can bond with the surface and a low energy end group pointing toward the free surface have been very successful as processing aides. These coatings can be applied from the liquid phase immediately after removal of the sacrificial layer to prevent adhesion as liquid dries from the part, or from the vapor phase once the liquid remaining after the release etch is supercritically extracted. In either case, the coupling agents form a chemisorbed monolayer of organic molecules that is ideally densely packed on the surface, so that the low energy end groups cover the entire surface. These surfaces are hydrophobic and resist the adsorption of water as well as organic contaminants much better than uncoated devices do. These types of coatings have been critical to having operating devices survive packaging operations and remain functional. However, it is well recognized that since these coatings are chemically bound to the surface and only a monolayer thick, that once they are displaced by wear or reaction with atmospheric species they leave the surface unprotected. Work over the last decade with various MEMS structures having sliding surfaces has shown that chemisorbed monolayers alone are insufficient to allow long operating life. Long-life MEMS devices with sliding surfaces will require a system for replenishing the lubricating layer as the device operates.

No commercial MEMS devices with repetitive sliding contacts exist today. MEMS devices are typically fabricated with silicon-based materials because mature lithographic fabrication techniques are available from the semiconductor industry; however, silicon and its native oxide exhibit high friction and poor wear resistance in sliding contacts. To overcome these problems, various coatings have been developed and extensively studied, but with questionable reliability and feasibility. Thin protective coatings are subject to wear during operation, limiting device lifetime. A means of continuously replenishing the protective layer on these surfaces is required to overcome this limitation. An additional requirement is that the lubricant must be deposited conformal to the surfaces, not possible with typical physical vapor deposition (PVD) techniques which deposit via line-of-site or chemical vapor deposition (CVD) techniques which deposit non-uniformly and do not easily coat buried surfaces. In vapor-phase lubrication (VPL), the adsorption of gas-phase molecules on device surfaces can produce a conformal lubricant layer. During sliding contact, adsorbed molecules can be desorbed from the surface; however, as long as the vapor pressure of lubricating molecules is maintained, these molecules immediately re-adsorb and replenish the lubricant film. Adsorbed films have been used to repassivate dynamic digital mirror arrays; but this device does not have deliberate sliding contacts. Previous VPL required elevated temperatures and lubricant molecule activation via precursor catalytic metal coatings. Useful would be a vapor-phase lubrication strategy that works in ambient conditions without special coatings.

DETAILED DESCRIPTION OF THE INVENTION

Figure 1:
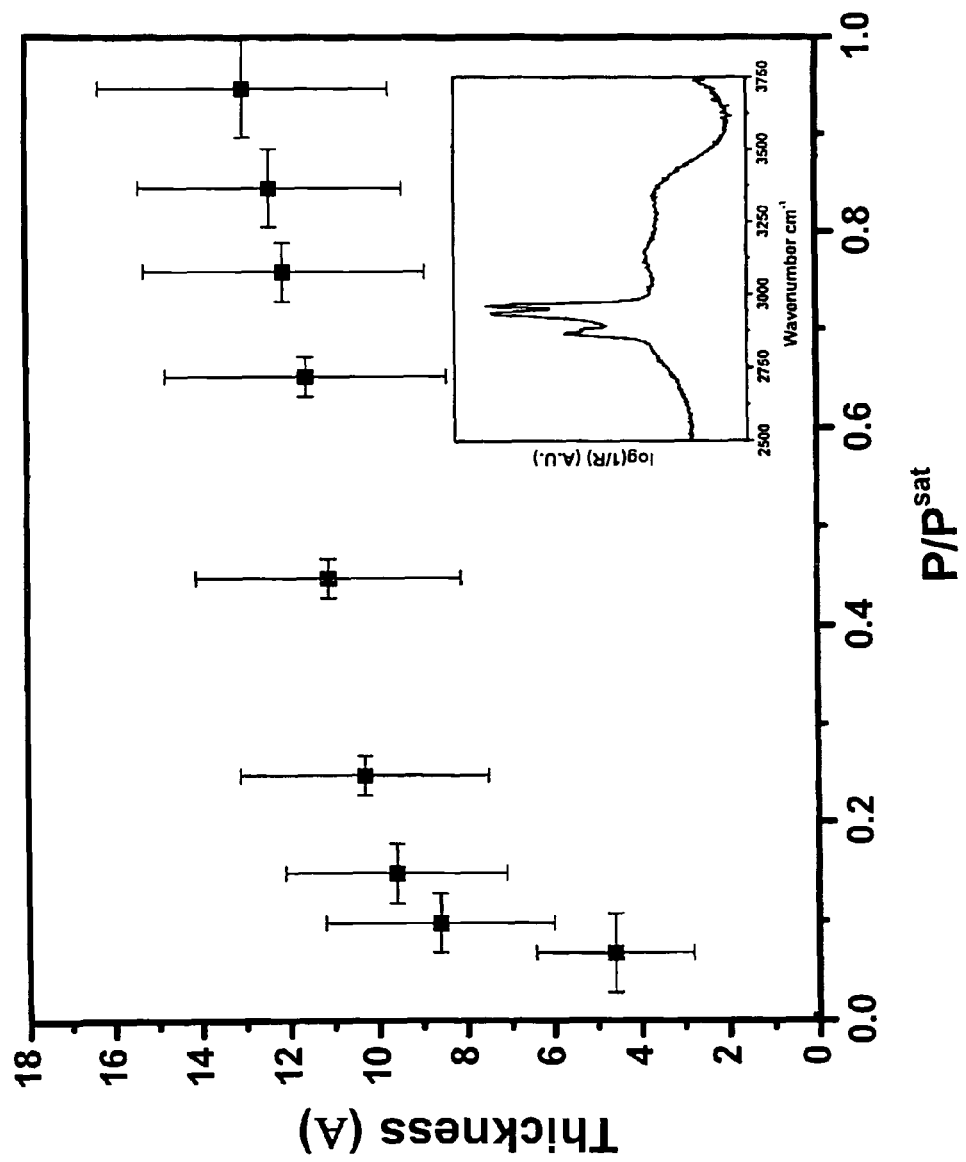
FIG. 1 shows the absorption isotherm for 1-pentanol.

In the method of the present invention, sliding surfaces requiring lubrication are operated in an environment containing vapor-phase alcohol compounds that can react at the surface of one or more sliding surfaces to act as a lubricant. Data obtained in the development of this method demonstrates that continuous tribochemical reactions of adsorbed alcohol molecules can reduce friction and prevent wear of surfaces over a wide range of size scales, from macro-scale to nano-scale (centimeters or even meters down to nanometers in size). Therefore, sliding, contacting surfaces can have lubricant protection as long as the surfaces are continuously exposed to a vapor-phase alcohol-containing environment with the concentration of the alcohol compounds above a critical alcohol concentration value, $C_a$, where this value is such that at least one monolayer of coverage is provided on at least one of the surfaces. This finding is especially important for lubrication of components and micro- and nano-scale mechanical devices made of silicon, since a robust lubrication approach for micromachine devices has eluded development until now, and new applications of micromachines requiring long duration operation should now be possible. Additionally, only a small amount of water vapor should be present. For example, using 1-pentanol as the alcohol in the vapor phase, the maximum concentration of water vapor, $C_w$, should be less than approximately 1000 pppmv. Note that this value depends on the alcohol or mixture of alcohol compounds where, as the volatility increases, the concentration value will increase. In general, the partial pressure or concentration of water in the vapor phase should be controlled such that there are at least two molecules of the alcohol compound, or mixtures of alcohols, for every water molecule present in the vapor phase.

In some applications where there exists high friction and poor wear resistance in sliding contacts, a means of continuously replenishing a protective layer on these surfaces is required to maintain a required device lifetime. In the method of the present invention, at least one of two surfaces is in motion relative to the other surface to provide a sliding contact wherein the sliding contact occurs in a vapor environment containing a critical concentration, $C_a$, of one or more vapor-phase alcohol compounds to provide lubrication at the contacting surfaces. This critical concentration required will vary with the compounds and surfaces of the particular application but must be sufficiently high to achieve one monolayer or more of coverage on at least one of the surfaces of the sliding contacts. This critical concentration value is equivalent to the vapor pressure of the alcohol compound or mixture of compounds divided by the saturation pressure ($P/P^{sat}$) at the temperature of operation. In one embodiment of the method of the present invention, the contacting length of the surfaces in motion relative to one another is less than one centimeter. In other anticipated applications, the maximum contacting length of the surfaces in contact is less than one millimeter and in other applications, such as in micromachines, the maximum contacting length of the surfaces in contact is less than 10 microns or even less than 1 micron.

The surfaces can be comprised of a variety of materials, including silicon (such as used in microelectromechanical systems (MEMS)), aluminum-based materials, Inconel, stainless steel materials, and other iron-based materials. Essentially any alcohol compound or mixture of alcohol compounds, including both aliphatic and aromatic alcohols, can be used, although long-carbon chain alcohols or aromatic-based alcohols of higher molecular weight might require elevated temperatures or adjusted pressures to achieve vapor-phase alcohols. There exists no inherent limitation on the compounds, surface materials, or operating conditions (for example temperature and pressure) as long as the alcohols in the vapor phase environment interact with at least one of the contact sliding surfaces through hydrogen bonding or chemical bonding via alkoxide chemistry to form generally one monolayer or more of adsorbed film on most of the surface. In general, the maximum surface length dimension of a surface which receives the alcohol coverage is one centimeter. The lubrication of sapphire surfaces with pentanol has been found to be ineffective. Sapphire is known to contain a very low density of hydroxyl sites on the surface, suggesting that the —OH bonds on the pentanol require hydroxyl sites on which to adsorb.

The vapor phase lubrication process described here will operate over any range of temperature and pressure such that 1) the temperature is above the freezing temperature of the alcohol, and 2) the concentration in the vapor phase is such that at least one monolayer is adsorbed on the surface. The method of the present invention includes the use of aliphatic alcohol compounds, especially those with carbon atoms less than or equal to approximately ten, and includes both branched and straight chain compounds. The method also includes the use of mixtures of these aliphatic alcohol compounds as well as mixtures of these aliphatic alcohol compounds with cyclic alcohol compounds such as cyclohexanol and benzyl alcohol. In other embodiments, oligomers of both the aliphatic alcohol compounds and cyclic alcohol compounds can be utilized, including oligomeric mixtures.

In developing the method of the present invention, extensive testing has been performed to investigate tribochemical reactions and tribological responses of native silicon oxide contacts in an alcohol vapor environment. In the embodiments discussed herein, environmental conditions were controlled by passing either dry argon or nitrogen (both non-reactive gases) through columns of liquid alcohol. The exiting gas from these bubblers was saturated with alcohol vapor molecules. The partial pressure of these molecules was maintained by mixing the saturated vapor stream with either dry nitrogen or argon at a constant ratio. In other embodiments, the vapor-phase alcohol compounds can be mixed with other carrier gases, either non-reactive or reactive. It is often beneficial to control the humidity of the vapor environment.

In the case of the described linear wear tests (LWT), the vapor stream (0.5 L/min) was directed towards the ball-on-flat approximately 2 cm away. The LWT was kept in a large glove box (490 L volume), which was constantly purged with dry nitrogen at a rate of approximately 9.5 L/min. Because of the close proximity, the partial pressure of the lubricant molecules immediately surrounding the contact was assumed to be equivalent to the partial pressure of the feed vapor stream. Atomic Force Microscopy (AFM) experiments were conducted in an environmental chamber (approximately 30 L volume) where the lubricant vapor was purged and allowed to come to equilibrium. Equilibrium adsorption experiments with attenuated total reflection infrared (ATR-IR) spectroscopy were carried out by passing the vapor gas over a clean silicon ATR crystal. MEMS testing was performed in a stainless steel environmental chamber where the vapor stream enters and then exits, vented to the laboratory exhaust. All measurements described herein were at room temperature.

LWT testing was performed with a custom-built ball-on-flat tribometer with a 3.125 mm diameter quartz ($SiO_2$) ball sliding on a Si(100) wafer at a speed of approximately 1.5 mm/sec with an applied load of 98 mN for 500 reciprocating cycles. Each test was performed with fresh surfaces. Silicon wafers with native oxide layers were cleaved to create samples approximately 1 cm square for testing. The quartz balls were cleaned via 15 min in a UV/Ozone chamber.

The sidewall MEMS devices were made up of polycrystalline silicon layers approximately 2 µm thick that were initially separated by silicon dioxide layers of similar thickness. The silicon and oxide layers were patterned to create complex structures and electrostatic actuators. After etching away the oxide layers in HF, the surfaces were oxidized by exposure to peroxide, and then rinsed in methanol. The methanol was extracted in supercritical $CO_2$ to avoid capillary formation. These devices were treated with a chemisorbed organic monolayer to make surfaces hydrophobic. A fluorinated monolayer tridecafluorotris(dimethylamino)silane, $CF_3(CF_2)_5(CH_2)_2Si(N(CH_3)_2)_3$ was applied by exposing cleaned surfaces to the molecule in a vacuum chamber at a total pressure of 2 mTorr for 12 minutes.

Lifetime for the MEMS devices was defined as the length of time (or number of cycles) the device continued to oscillate using the on-chip electrostatic actuator under a given load. Friction in these devices was determined by monitoring the difference between the ranges of shuttle motion with and without load. This difference in range of motion (a length) was multiplied by the spring constant of the shuttle to yield the frictional force. Adhesion was measured by applying a voltage to the unloading actuators on the post. At the point of separation, this voltage was recorded. The adhesive force is the sum of the force applied at the unload actuators (proportional to the applied voltage squared) and the initial loading force required to make the contact.

It is known that alcohol molecules exhibit appreciable vapor pressure at room temperature, and have a strong interaction with oxide-terminated silicon surfaces through hydrogen bonding. Additionally, VPL molecules adsorb conformally to the surfaces. The equilibrium adsorption of simple alcohol molecules prevented silicon oxide wear over a large range of length scales (macroscopic to nanoscopic). Additionally, tribochemical reactions occurring within the contact produced high molecular weight oligomers which help prevent wear. The method of the present invention provides efficient ways to greatly improve operation lifetimes of MEMS devices and mitigate wear of atomic force microscopy (AFM) tips during contact scanning. The devices are operated in an atmosphere containing a surface-active alcohol-containing species in the vapor phase. Simple alcohol molecules, with —OH groups on one end, are such species and are able to adsorb on oxidized silicon surfaces. These molecules adsorb on top of the chemisorbed monolayer, but will adsorb much more readily on areas where the monolayer is damaged to expose —OH sites or even silicon dangling bonds.

In one embodiment, the surfaces used were made of silicon and the alcohol compound was 1-pentanol. Pentanol was selected for much of the testing for safety reasons, because the saturation vapor pressure is well below the flammability limit at room temperature. However, this means that the actual concentration of alcohol molecules in the vapor phase is quite low. For example, $P^{sat}$ for pentanol at 21° C. is 2 mbar, so that 20% of saturation corresponds to an alcohol concentration of less than 500 ppm. In other tests, alcohol compounds using from two to ten carbon atoms were used with successful tribological results. ATR-IR spectroscopy was used to determine the thickness of adsorbed 1-pentanol layers. The adsorption isotherm behavior of 1-pentanol on native silicon oxide is presented in FIG. 1. The adsorption follows a Langmuir-type adsorption isotherm. Monolayer coverage occurs at $P/P^{sat}$ equal to approximately 8-10% for 1-pentanol, and above this vapor pressure alcohol adsorption increases only slightly.

Figure 2:
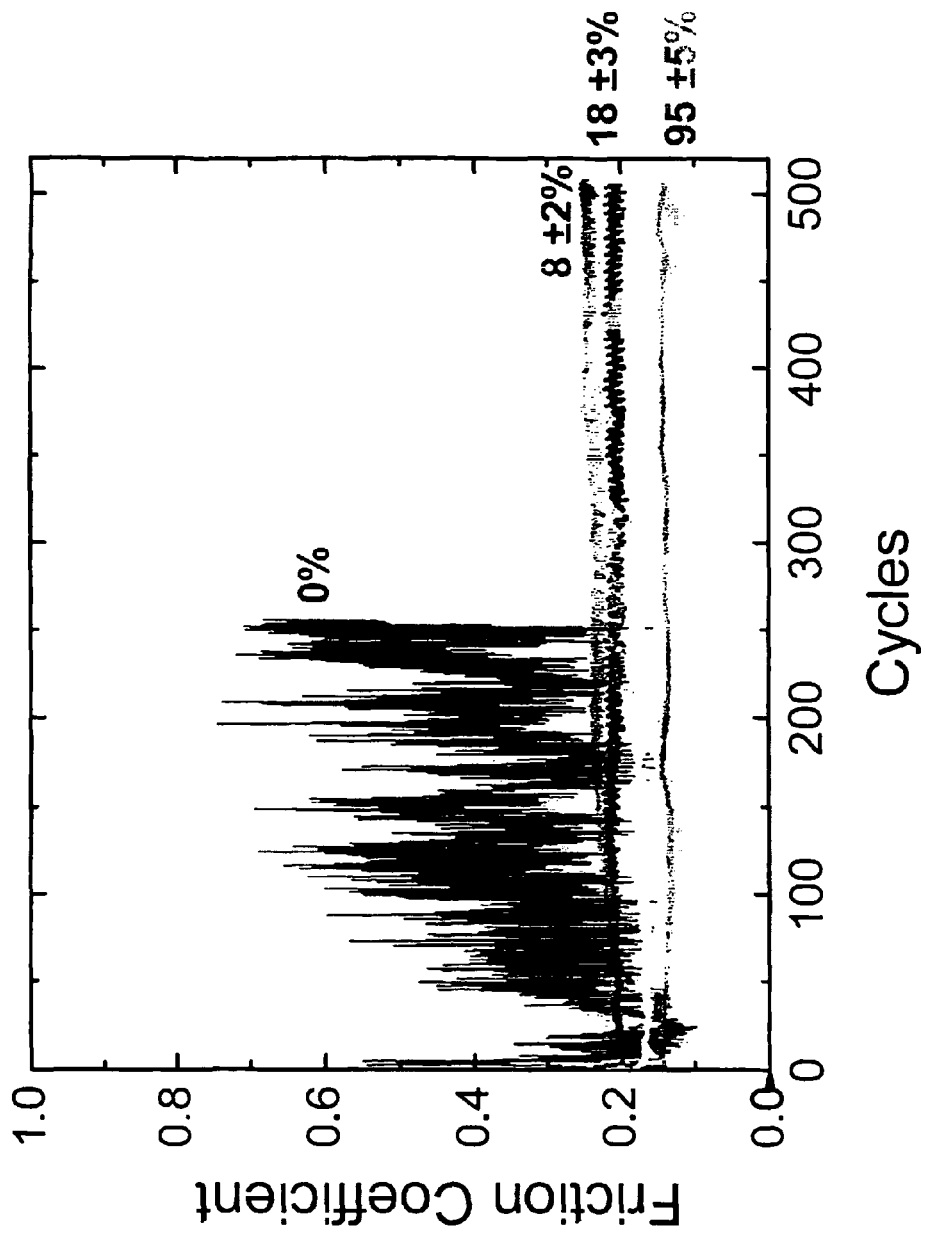
FIG. 2 shows the change in frictional behavior as a function of the relative partial pressure of 1-pentanol for a linear wear test between a 3.2 mm diameter $SiO_2$ sphere and a silicon surface with a native oxide.

At the millimeter scale, a linear wear test was used to investigate the efficacy of alcohol adsorption in wear prevention. The LWT data for silicon (with approximately 20 Å native oxide) sliding against silicon oxide (quartz) spheres in varying amounts of 1-pentanol vapor confirm the isotherm behavior. The applied load is 98 mN, the sliding speed is approximately 1.5 mm/s, and the baseline environment is dry $N_2$ (<100 ppm $H_2O$ and <10 ppm $O_2$), providing a Hertzian contact pressure of approximately 115 MPa. FIG. 2 illustrates the change in frictional behavior as a function of the partial pressure of 1-pentanol. In dry $N_2$ (the curve labeled "0%"), the friction coefficient value starts near 0.2 but rapidly increases to approximately 0.6. This friction coefficient is accompanied by extensive surface damage and debris formation. However, when a small amount of pentanol vapor is added to the environment, the friction remains near 0.2 and is much less erratic, indicative of low levels of debris production. At concentrations above 2% ($P/P_{sat}$>0.02), the friction coefficient is found to monotonically decrease with increasing pentanol vapor concentration. As the concentration of 1-pentanol vapor increases towards the saturation pressure ($P^{sat}$), the observed frictional response decreases. When no alcohol vapors are present, erratic behavior is observed and wear debris are generated causing sporadic $3^{rd}$ body contact effects, manifested as large fluctuations in friction. With a small amount of alcohol vapors present, this behavior quickly changes. At approximately 4% of $P^{sat}$, some erratic behavior is observed; however when approximately 8% of $P^{sat}$ is achieved this behavior disappears. Thus, the critical concentration of alcohol required for this system is determined to by approximately $P/P^{sat}$=8%. The lower regions of frictional response at 4% could be attributed to $3^{rd}$ body lubrication. As the surface wears, some smaller particles become trapped in between the sphere and substrate. These smaller particles have some adsorbed alcohol molecules and this combination of loose debris with partial alcohol coverage provides lower frictional response. However, wear is not completely prevented at this condition. Any additional alcohol above 8% reduces the friction coefficient only modestly. These conditions correspond well with the isotherm thickness behavior; that is, effective lubrication is demonstrated once the surface is covered with a monolayer of adsorbed alcohol. Optical profilometry images of the sliding contact region showed that small amounts of alcohol vapors drastically reduce the wear debris production on silicon. No wear debris is observed for any conditions when the relative partial pressure of alcohol is ≧8% of $P^{sat}$. If alcohol vapors are removed, the wear process eventually resumes, indicating that alcohol lubrication requires continual replenishment.

At the nano-scale, the AFM was utilized to study the effect of adsorbed alcohol molecules on silicon single asperity sliding. Sliding experiments were conducted by reciprocating an AFM silicon tip on a clean Si(100) substrate at a speed of 2 μm/sec over a ~1 μm long line for 512 times with a 75 nN applied load, providing a Hertzian contact pressure of ~3 GPa. Then, the scratched region was imaged using a 3 nN load. AFM topography images showed that, for the test in 1-propanol vapor at 75% of $P^{sat}$, no discernable wear trench occurs while the test in 75% humid vapor leaves a 1 nm deep wear trench. On high surface energy silicon oxide surfaces exposed to humid air, there are always thin water layers adsorbed on the surface which are in equilibrium with water in the gas phase. Although strongly bound hydrating layers formed on certain mineral surfaces (such as mica) show remarkable lubrication ability for atomically smooth surfaces, water is not a good lubricant for silicon oxide asperity contacts. The adsorbed water forms hydrated silicon oxide, which is susceptible to wear. By replacing water (H—OH) with alcohol (R—OH), chemical wear of silicon is prevented. Nano-scale wear prevention was also observed for other alcohols tested in this experiment (ethanol ($C_2$) through 1-pentanol ($C_5$)).

Figure 3:
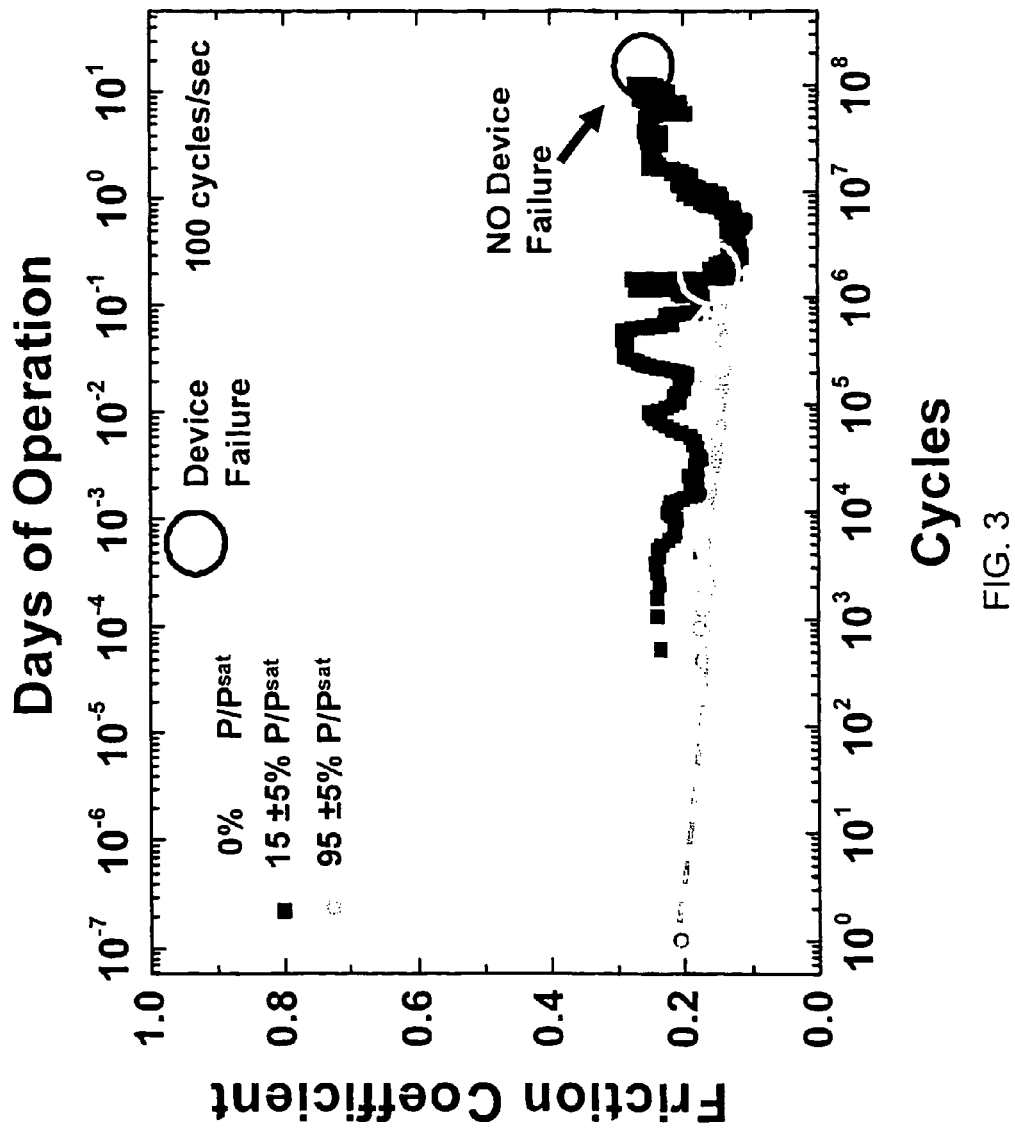
FIG. 3 shows the friction force vs cycles in a MEMS sidewall device under 500 nN load at 100 Hz oscillation.

MEMS sidewall friction devices were employed to investigate tribology at the micro-scale. These devices are initially covered with the tridecafluorotris(dimethylamino)silane monolayer. In a regulated environment, a movable shuttle was driven back and forth (approximately 3 mm/sec) against a stationary post while a 500 nN load was applied (see FIG. 3). Contact pressure in the MEMS device was estimated to be approximately 20 MPa assuming smooth surfaces and Hertzian deformations. However, in a real contact, only a handful of contacting asperities are present due to the surface roughness. Therefore, the actual contact stresses inside the real asperity contacts probably lie somewhere between this value and a few GPa (the typical contact stress of a single nano-asperity).

AFM topography images showed that there are vast improvements in friction and lifetime characteristics of the MEMS device in the presence of 1-pentanol vapor. In dry $N_2$ conditions, with the tridecafluorotris(dimethylamino)silane monolayer alone, friction quickly and sporadically increases and the device fails in less than $10^4$ cycles (<2 minutes at a 100 Hz operation). This failure is due to wear. Failure is defined as the number of cycles the device operates until the actuation force available with the built-in actuator is insufficient to slide the surfaces past one another. Several devices have been run in a $N_2$ environment containing 95% pentanol vapor (P/Psat=0.95). In all cases, these tests were stopped in order to examine the surfaces prior to any device failure. One device was run at 15% of saturation for 100 million cycles, and again was stopped for surface examination prior to failure. Although no significant debris is observed upon examination in scanning electron microscopy (SEM) due to device failure before accumulation of wear debris, a change in friction is an indication of removal of the surface passivation. Additionally, the initial tridecafluorotris(dimethylamino)silane coated surfaces provided an average adhesion of approximately 100 nN. At failure, the measured adhesion increased 2 to 4 times the initial value, indicating a change in surface chemistry. In dry nitrogen, wear of the fluorinated layer exposes bare silicon on both the shuttle and post; their interactions eventually cause the surfaces to stick together.

The lifetime of MEMS devices in the presence of 1-pentanol vapors is greatly increased. When the 1-pentanol vapor pressure is maintained above the partial pressure needed for monolayer coverage, friction remains low and the device does not fail. After more than 3 hours of operation at 95% of $P^{sat}$, the device was stopped by the user and adhesion was measured. There was no discernable change in adhesion compared to the adhesion prior to lateral motion, indicating no wear of the contact surfaces. Even after more than $10^8$ cycles of operation (11 days at a reciprocating rate of 100 Hz) at approximately 15% of $P^{sat}$, the device does not fail or show any sign of wear under SEM examination. In this case, small liquid-like deposits are observed adjacent to tall asperities. Additionally, there is a small increase in the observed adhesion following $10^8$ cycles. However, the change in adhesion was not sufficient to interrupt the device performance. This material does not dissolve in pentanol even with gentle heating.

The absence of evidence for wear of the polycrystalline silicon, even after 100 million operations, is noteworthy. There are deposits observed on this surface, though, that are not observed on surfaces that have not been operated for long duration in the presence of alcohol vapor. These deposits are believed to be reaction products consisting of long-chain hydrocarbons created by the reaction of alcohol molecules with the surface at the real points of contact. Therefore, it appears that a lubricating film is generated in situ at locations of real contact by reaction of the alcohol molecules with the surface. Although the concept has been demonstrated using pure pentanol, which remains liquid down to −73° C., operation can occur in an environment containing different constituents with vapor pressures tailored to the operating temperature range of the device that would result in adequate film formation over a range of temperatures. Furthermore, the simple alcohol molecules used in the initial tests can be replaced with other species that generate an even lower surface energy reaction product. These constituents can be impregnated in a porous medium, such as an in-package desiccator, to deliver the vapor phase constituent at a controlled rate over the storage life of the device.

In one embodiment of the method of the present invention, the delivery of the vapor phase alcohol to the surface to be lubricated is controlled. If a device containing surfaces to be lubricated is open or has a large head volume, a flow system can be built into the system. However, if the device is in a closed environment, such as hermetically sealed, this may not be possible. In this case, a small gas-release source can be included in the sealed device. Because the molar volume of the gas phase is more than three orders of magnitude larger than that of the condensed phase, the inclusion of a small liquid or solid material will be enough for gas release for a long period of time. Therefore, in a closed environment, an alcohol source can be emplaced to deliver an alcohol compound, or mixture of alcohol compounds, to the vapor phase where the alcohols can subsequently contact and lubricate the contacting surfaces in motion. The alcohol source can be contained within a solid or liquid. For example, the alcohol compounds can be delivered by the controlled out-gassing of polymers saturated with alcohol, by controlled out-gassing of porous materials containing alcohol or by using capillary reservoirs filled with these liquids. Inside of a MEMS package, for example, any one or combination of these can be used to maintain the alcohol vapor pressure for lubrication and wear prevention. The temperature of the reservoir, porous system, capillaries, or polymer systems can be controlled inside of the device to control the relative partial pressure of the alcohol lubricants. For example, a liquid lubricant condensed in a meso-porous adsorbant can be a good gas release source in such a sealed environment. The thermal equilibrium between the condensed liquid phase and the gas phase will keep a constant partial pressure of the lubricant vapor. Note that only a few percent of the saturation partial pressure is needed for the gas phase lubrication and this process is not limited to alcohol molecules.

If the use of an adsorbant is not suitable due to a high temperature sealing process, an alternative way is to utilize thermal or electron-induced degradation of solid materials. In one embodiment, a solid-phase polymer material is stored in a reservoir space. The solid material is heated with a microheater to melt the polymer and bring it to the central heating zone where the polymer will degrade, generating vapor-phase decomposition products. If the local heating causes a problem in device operations, an electric arc method or other heating method can be employed. For applications in sealed environments, the thermal degradation should produce lubricant vapors in a controlled way without generating non-lubricating molecules such as $H_2O$ and $CO_2$. Otherwise, the pressure build-up in the device will eventually crack open the seal. One such material that can be used is polydimethylsiloxane, containing either silanol (Si—OH) or hydroxylalkyl (Si—R—OH) end groups. These polymers depolymerize at approximately 350° C. by an "unzipping" degradation mechanism, selectively producing volatile trimeric or tetrameric cyclosiloxanes. The depolymerization temperature can be lowered down to approximately 150° C. by adding a catalyst. Another such material is polyacrylonitrile (with a degradation temperature much greater than 200° C.).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method for providing tribological lubrication to sliding contact surfaces in a closed environment, comprising: providing a closed environment containing at least a first surface with a contacting length less than one centimeter and a second surface with a contacting length less than one centimeter, at least one of said surfaces in motion relative to the other to provide contact between the surfaces, said closed environment containing a source of at least one alcohol compound, such source capable of delivery of the at least one alcohol compound in a vapor phase at a critical alcohol concentration, $C_a$, where $C_a$ has a value sufficiently high to provide at least one monolayer of alcohol coverage on at least one of the surfaces, said vapor phase having a maximum water vapor concentration such that there are at least two molecules of the at least one alcohol compound for every molecule of water in the vapor phase, and wherein said source of the at least one alcohol is a solid-phase polymer wherein said delivery of said at least one alcohol occurs by heating said solid-phase polymer to induce vapor-phase decomposition products.

2. The method of claim 1 wherein said solid-phase polymer is selected from the group consisting of polydimethylsiloxane and polyacrylonitrile.

3. The method of claim 1 wherein said critical alcohol concentration $C_a$ is given by the alcohol pressure (P) divided by the saturation pressure ($P^{sat}$) wherein $P/P^{sat}$ is greater than 0.02 and less than 0.10.

4. The method of claim 1 wherein said alcohol is an aliphatic alcohol containing less than or equal to 10 carbon atoms.

5. The method of claim 3 wherein the at least one alcohol compound comprises pentanol and $P/P^{sat}$ is greater than 0.02 and less than 0.08.

* * * * *